United States Patent
Wang et al.

(10) Patent No.: US 8,379,365 B2
(45) Date of Patent: Feb. 19, 2013

(54) METAL OXIDE METAL CAPACITOR WITH SLOT VIAS

(75) Inventors: Chin-Shan Wang, Hsinchu (TW);
Jian-Hong Lin, Yunlin (TW);
Chien-Jung Wang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 325 days.

(21) Appl. No.: 12/768,001

(22) Filed: Apr. 27, 2010

(65) Prior Publication Data

US 2010/0271753 A1    Oct. 28, 2010

Related U.S. Application Data

(60) Provisional application No. 61/173,439, filed on Apr. 28, 2009.

(51) Int. Cl.
*H01G 4/005* (2006.01)
*H01G 4/06* (2006.01)
(52) U.S. Cl. ......................... 361/303; 361/311
(58) Field of Classification Search ............. 361/303, 361/311, 305
See application file for complete search history.

(56) References Cited

U.S. PATENT DOCUMENTS

| | | | |
|---|---|---|---|
| 2008/0079117 A1* | 4/2008 | Baumgartner et al. | 257/532 |
| 2009/0097186 A1* | 4/2009 | Topaloglu | 361/306.3 |

* cited by examiner

*Primary Examiner* — Eric Thomas
(74) *Attorney, Agent, or Firm* — Lowe Hauptman Ham & Berner, LLP

(57) ABSTRACT

A capacitor includes the first electrode including the first conductive lines and vias. The first conductive lines on the same layer are parallel to each other and connected to a first periphery conductive line. The first conductor lines are aligned in adjacent layers and are coupled to each other by the vias. The capacitor further includes a second electrode aligned opposite to the first electrode including second conductive lines and vias. The second conductive lines on the same layer are parallel to each other and connected to a second periphery conductive line. The second conductor lines are aligned in adjacent layers and are coupled to each other by the vias. The capacitor further includes oxide layers formed between the first electrode and the second electrode. The vias have rectangular (slot) shapes on a layout. In one embodiment, the conductive lines and vias are metal, e.g. copper, aluminum, or tungsten.

20 Claims, 3 Drawing Sheets

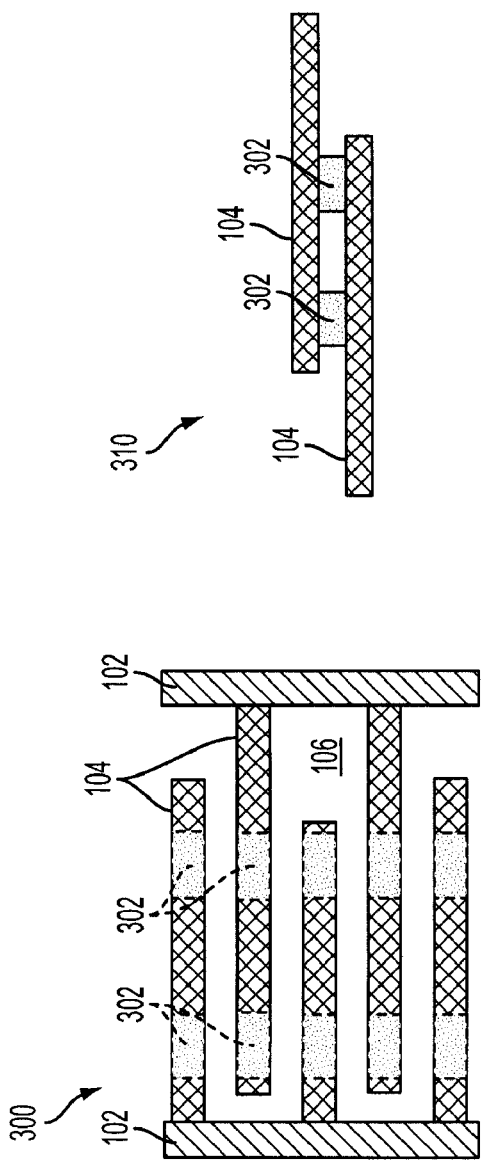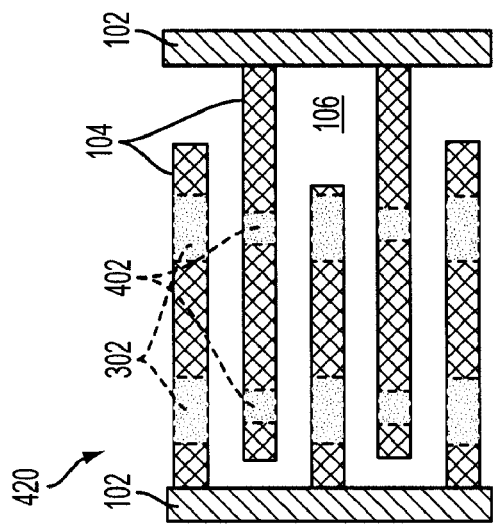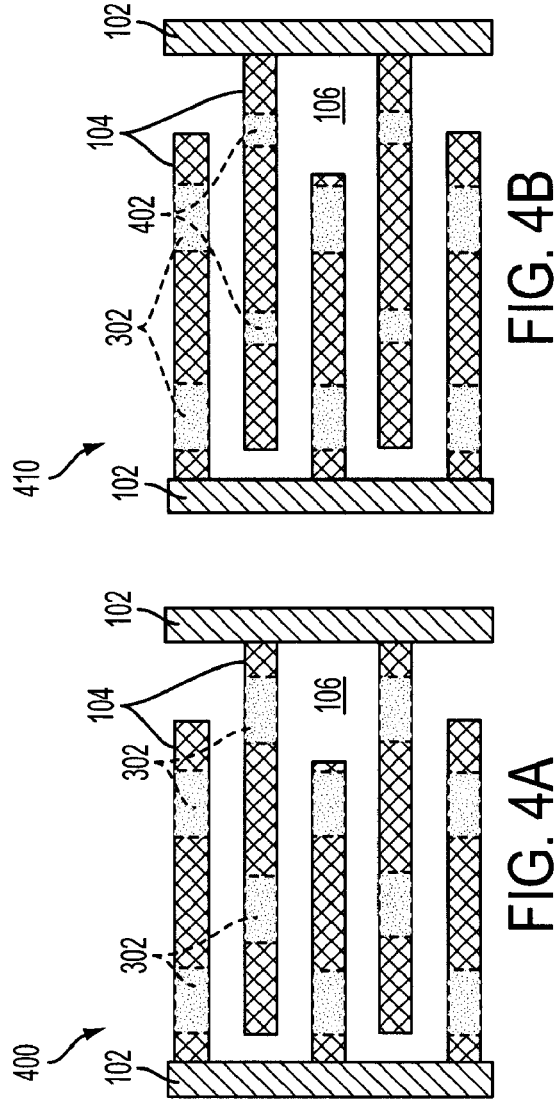

METAL OXIDE METAL CAPACITOR WITH SLOT VIAS

CROSS-REFERENCE TO RELATED APPLICATIONS

The present application claims priority of U.S. Provisional Patent Application Ser. No. 61/173,439, filed on Apr. 28, 2009, which is incorporated herein by reference in its entirety.

TECHNICAL FIELD

This disclosure relates generally to Metal Oxide Metal (MOM) capacitor, more specifically MOM capacitor with a slot (rectangular) via structure.

BACKGROUND

An exemplary single layer Metal-oxide-metal (MOM) capacitor structure is shown in FIG. 1A. The structure 100 has periphery metal 102, metal lines 104, and dielectric (oxide) layers 106. To increase the area usage efficiency, multiple layers of MOM capacitor structures could be vertically stacked together. FIG. 1B illustrates a stack (multi-layer) MOM capacitor structure, using vias 112 to connect each layer.

MOM capacitors have been used in the integrated circuits increasingly more often, partly because their minimal capacitive loss to the substrate results in high quality capacitors. Also, MOM capacitors with via have low cost and are easy to implement using a standard logic process. However, conventional MOM capacitors with via tend to have low capacitance and high resistance. Accordingly, important goals in manufacturing MOM capacitors are to increase the capacitance and reduce capacitor resistance, especially for Mixed Signal Radio Frequency (MSRF) product applications. Further, via resistance uniformity and reliable performance are important issues for MOM capacitors with high via density.

Accordingly, new structures and methods for MOM capacitors are desired to achieve higher capacitance and lower resistance, as well as performance reliability.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3A illustrates a top view of an exemplary multi-layer MOM capacitor structure according to one aspect of this disclosure with vias shown in dotted lines underneath the metal lines;

FIG. 3B illustrates a partial side view of an exemplary multi-layer MOM capacitor structure according to one aspect of this disclosure with vias between two metal layers;

FIG. 4A-FIG. 4C illustrate a top view of other embodiments of a multi-layer MOM capacitor structure according to one aspect of this disclosure with vias shown in dotted lines underneath the metal lines.

DETAILED DESCRIPTION OF ILLUSTRATIVE EMBODIMENTS

The making and using of the presently preferred embodiments are discussed in detail below. It should be appreciated, however, that the present disclosure provides many applicable novel concepts that can be embodied in a wide variety of specific contexts. The specific embodiments discussed are merely illustrative and do not limit the scope of the disclosure.

A novel structure for Metal-oxide-metal (MOM) capacitor with slot (rectangular) vias is provided. The structure uses slot (rectangular) vias to lower resistance and increase capacitance due to extended via length and increased sidewall area. Throughout the various views and illustrative embodiments of the present disclosure, like reference numbers are used to designate like elements.

Figure 1A:
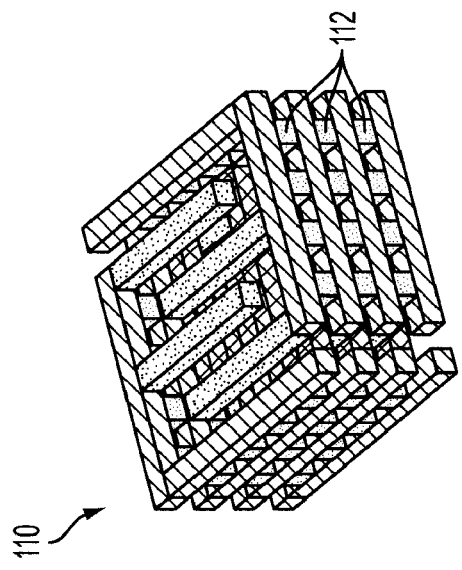
FIG. 1A illustrates an exemplary single layer Metal-oxide-metal (MOM) capacitor structure.
Figure 1B:
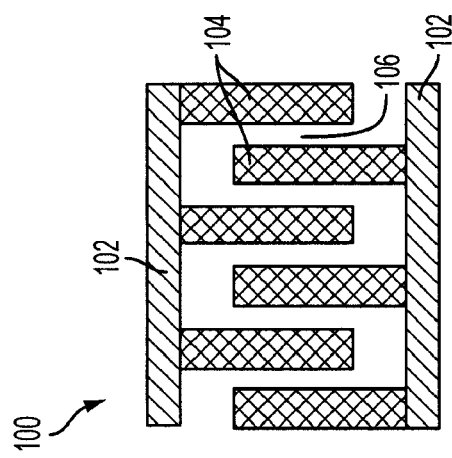
FIG. 1B illustrates a stack (multi-layer) MOM capacitor structure, using vias to connect each layer.
Figure 2A:
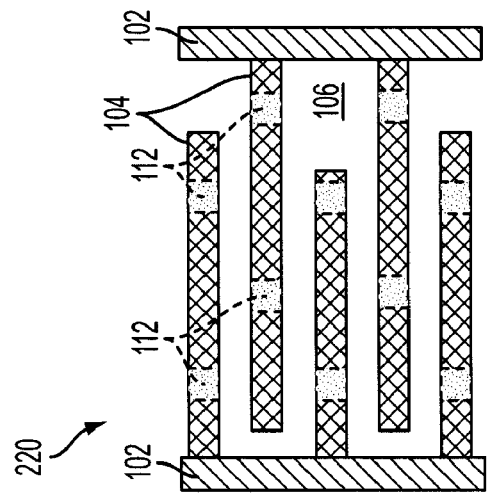
FIG. 2A illustrates a top view of an example of a conventional multi-layer MOM capacitor structure with vias shown in dotted lines underneath the metal lines.

FIG. 2A illustrates a top view of an example of a conventional multi-layer MOM capacitor structure 200 with vias shown in dotted lines underneath the metal lines. The structure 200 has periphery metal 102, metal lines 104, and dielectric (oxide) layers 106. The vias 112 are square vias with a fixed size depending on the process (e.g. 0.05 µm×0.05 µm in a 32 nm process). The vias 112 are aligned with each other across multiple metal lines 104 from the top-view shown in FIG. 2A. The vias 112 connect each metal layer of the multi-layer MOM structure 200.

Figure 2B:
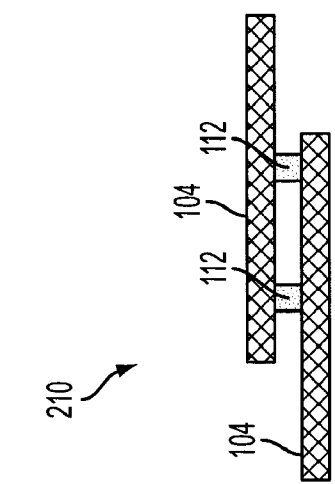
FIG. 2B illustrates a partial side view of a conventional multi-layer MOM capacitor structure with vias between two metal layers.

FIG. 2B illustrates a partial side view of a conventional multi-layer MOM capacitor structure with vias between two metal layers. The vias 112 connect metal lines 104 on different layers.

Figure 2C:
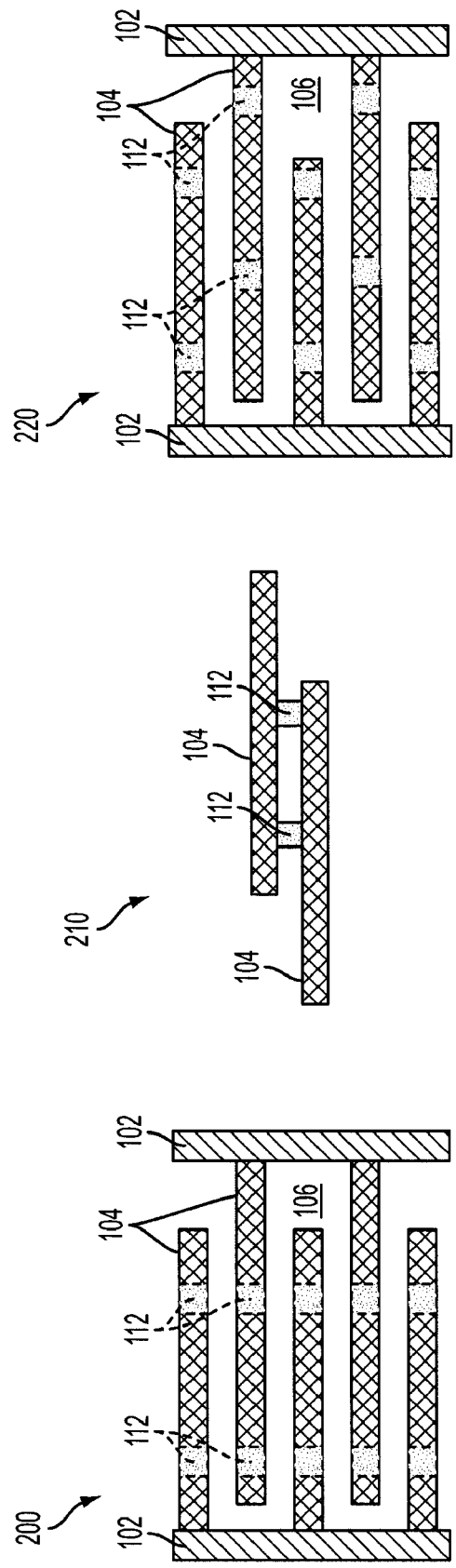
FIG. 2C illustrates a top view of an example of another conventional multi-layer MOM capacitor structure with vias shown in dotted lines underneath the metal lines.

FIG. 2C illustrates a top view of an example of another conventional multi-layer MOM capacitor structure with vias shown in dotted lines underneath the metal lines. The structure 220 has periphery metal 102, metal lines 104, and dielectric (oxide) layers 106. The vias 112 are square vias with a fixed size depending on the process. The vias 112 are staggered across multiple metal lines 104 from the top-view shown in FIG. 2C. Even though the layout of the structure 220 is different from that of the structure 200, they both use fixed size square vias 112 to connect metal lines 104 between each layer.

FIG. 3A illustrates a top view of an exemplary multi-layer MOM capacitor structure according to one aspect of this disclosure with vias shown in dotted lines underneath the metal lines. The structure 300 has periphery metal 102, metal lines 104, and dielectric (oxide) layers 106. The periphery metal 102 and metal lines 104 could be copper, aluminum, tungsten, etc. The vias 302 are slot (rectangular) vias with a variable size depending on the process (e.g., 0.05 µm×0.13 µm in a 32 nm process). The vias 302 are aligned with each other across multiple metal lines 104 from the top-view shown in FIG. 3A. The vias 112 connect each metal layer of the multi-layer MOM structure 300. MOM capacitor with slot via structure can increase capacitance and reduce resistance by extended via length and increased via sidewall area.

In one embodiment of the structure 300 using the slot vias 302 with the size of 0.05 μm×0.13 μm, the capacitance increased about 1.6 times (10.34 pF), compared to one embodiment of the structure 200 using square vias 112 with the size of 0.05 μm×0.05 μm (6.477 pF). This capacitance increase is due to extended via length and increased sidewall area from using slot (rectangular) 302 instead of square vias 112.

FIG. 3B illustrates a partial side view of an exemplary multi-layer MOM capacitor structure according to one aspect of this disclosure with vias between two metal layers. The vias 302 connect metal lines 104 on different layers.

FIG. 4A-FIG. 4C illustrate a top view of other embodiments of a multi-layer MOM capacitor structure according to one aspect of this disclosure with vias shown in dotted lines underneath the metal lines. In FIG. 4A, the structure 400 has periphery metal 102, metal lines 104, and dielectric (oxide) layers 106. The vias 302 are slot (rectangular) vias with a variable size depending on the process (e.g., 0.05 μm×0.13 μm). The vias 302 are staggered across multiple metal lines 104 in the y-direction from the top-view shown in FIG. 4A. Even though the layout of the structure 400 is different from that of the structure 300, they both use slot vias 302 to connect metal lines 104 between each layer.

In FIG. 4B, the structure 410 has periphery metal 102, metal lines 104, and dielectric (oxide) layers 106. The vias 302 are slot (rectangular) vias with a variable size depending on the process (e.g., 0.05 μm×0.13 μm). The vias 402 are square vias with a variable size depending on the process (e.g. 0.05 μm×0.05 μm). In the structure 410, the vias 302 and 402 are used together (each on separate metal lines 104) and staggered across multiple metal lines 104 from the top-view shown in FIG. 4B. In another embodiment, the vias 302 and 402 can be mixed together in the same metal lines 104.

In FIG. 4C, the structure 420 has periphery metal 102, metal lines 104, and dielectric (oxide) layers 106. Like the structure 410, the vias 302 and 402 are used together (each on separate metal lines 104) in the structure 420, but the vias 302 and 402 are aligned with each other across multiple metal lines 104 from the top-view shown in FIG. 4C. In another embodiment, the vias 302 and 402 can be mixed together in the same metal lines 104.

Figure 5A:
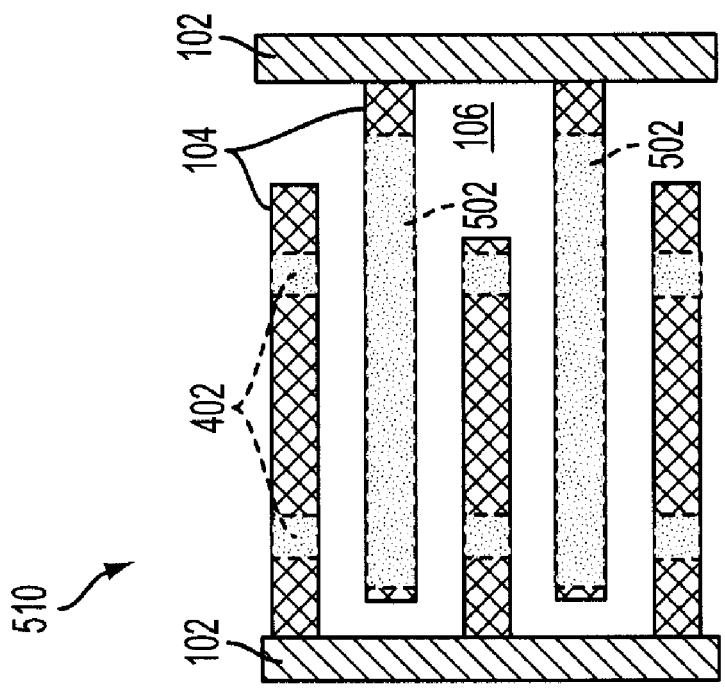
FIG. 5A-FIG. 5B illustrate a top view of different embodiments of a multi-layer MOM capacitor structure according to another aspect of this disclosure with vias shown in dotted lines underneath the metal lines.
Figure 5B:
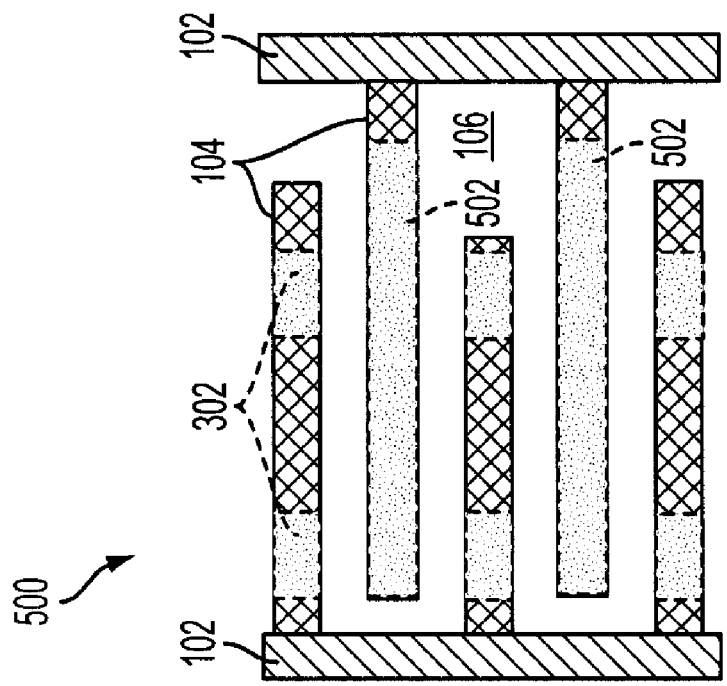

FIG. 5A-FIG. 5B illustrate a top view of different embodiments of a multi-layer MOM capacitor structure according to another aspect of this disclosure with vias shown in dotted lines underneath the metal lines. In FIG. 5A, the structure 500 has periphery metal 102, metal lines 104, and dielectric (oxide) layers 106. The vias 302 are slot (rectangular) vias with a variable size depending on the process (e.g., 0.05 μm×0.13 μm). The vias 502 are different size (elongated) rectangular vias. The vias 302 and 502 are alternating on different metal lines 104. The vias 302 are aligned with each other across multiple metal lines 104 from the top-view shown in FIG. 5A.

In FIG. 5B, the structure 510 has periphery metal 102, metal lines 104, and dielectric (oxide) layers 106. The vias 402 are square vias with a variable size depending on the process (e.g. 0.05 μm×0.05 μm). The vias 502 are elongated rectangular vias with a variable size depending on the process. The vias 402 and 502 are alternating on different metal lines 104. The vias 402 are aligned with each other across multiple metal lines 104 from the top-view shown in FIG. 5B.

The advantages of the new structures include increased capacitance and reduced resistance due to extended via lengths and increased via sidewall area. A skilled person in the art will appreciate that there can be many embodiment variations of this disclosure. For example, instead of slot (rectangular) vias, vias with other shapes (e.g. circular, oval, etc.) could be used, and many different size vias could be mixed and arranged in the structures for different embodiments.

Although the present disclosure and its advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized.

What is claimed is:

1. A capacitor comprising:
    a first electrode comprising a plurality of first conductive lines and vias, wherein the first conductive lines on the same layer are parallel to each other and connected to a first periphery conductive line, and the first conductor lines aligned in adjacent layers are coupled to each other by the vias, wherein the vias connected to the first conductive lines have a first length parallel to the first conductive lines;
    a second electrode aligned opposite to the first electrode comprising a plurality of second conductive lines and vias, wherein the second conductive lines on the same layer are parallel to each other and connected to a second periphery conductive line, and the second conductor lines aligned in adjacent layers are coupled to each other by the vias, wherein the vias connected to the second conductive lines have a second length parallel to the second conductive lines and different than the first length; and
    oxide layers formed between the first electrode and the second electrode,
    wherein the vias have rectangular shape on a layout.

2. The capacitor of claim 1, wherein the first conductive lines and the second conductive lines are metal.

3. The capacitor of claim 2, wherein the first conductive lines and the second conductive lines are copper, aluminum, or tungsten.

4. The capacitor of claim 1, wherein the vias are metal.

5. The capacitor of claim 4, wherein the vias are copper, aluminum, or tungsten.

6. The capacitor of claim 1, wherein the vias are aligned with each other across the first conductive lines and the second conductive lines on the same layer.

7. The capacitor of claim 1, wherein the vias are staggered across the first conductive lines and the second conductive lines on the same layer.

8. The capacitor of claim 1, wherein the vias have rectangular shape of various sizes.

9. The capacitor of claim 1, wherein the vias have both rectangular and square shapes.

10. The capacitor of claim 9, wherein the vias coupling the first conductive lines are rectangular while the vias coupling the second conductive lines are square.

11. A capacitor comprising:
    a first electrode comprising a plurality of first metal lines and vias, wherein the first metal lines on the same layer are parallel to each other and connected to a first periphery metal line, and the first metal lines aligned in adjacent layers are coupled to each other by the vias, wherein at least one first via connected to the first conductive lines has a first length parallel to the first conductive lines, at least one second via connected to the first conductive lines has a second length parallel to the first conductive line, and the first length is different from the second length;

a second electrode aligned opposite to the first electrode comprising a plurality of second metal lines and vias, wherein the second metal lines on the same layer are parallel to each other and connected to a second periphery metal line, and the second metal lines aligned in adjacent layers are coupled to each other by the vias, wherein at least one third via connected to the second conductive lines has a third length parallel to the second conductive lines and the third length is equal to one of the first length or second length; and oxide layers formed between the first electrode and the second electrode, wherein the vias have rectangular shape on a layout.

12. The capacitor of claim 11, wherein the first metal lines, the second metal lines, and vias are copper, aluminum, or tungsten.

13. The capacitor of claim 11, wherein the vias are aligned with each other across the first metal lines and the second metal lines on the same layer.

14. The capacitor of claim 13, wherein the vias are staggered across the first metal lines and the second metal lines on the same layer.

15. The capacitor of claim 11, wherein the vias have rectangular shape of various sizes.

16. The capacitor of claim 11, wherein the vias have both rectangular and square shapes.

17. The capacitor of claim 11, wherein at least one fourth via connected to the second conductive lines has a fourth length parallel to the second conductive lines and the fourth length is different than the third length.

18. A capacitor comprising:

a first electrode comprising a plurality of first metal lines and vias, wherein the first metal lines on the same layer are parallel to each other and connected to a first periphery metal line, and the first metal lines aligned in adjacent layers are coupled to each other by the vias, wherein the vias connected to the first metal lines have a first length parallel to the first metal lines;

a second electrode aligned opposite to the first electrode comprising a plurality of second metal lines and vias, wherein the second metal lines on the same layer are parallel to each other and connected to a second periphery metal line, and the second metal lines aligned in adjacent layers are coupled to each other by the vias, wherein the vias connected to the second conductive lines have a second length parallel to the second conductive lines and different than the first length; and oxide layers formed between the first electrode and the second electrode, wherein the first metal lines, the second metal lines, and vias are copper, aluminum, or tungsten, and the vias have rectangular shape on a layout.

19. The capacitor of claim 18, wherein the vias have rectangular shape of various sizes.

20. The capacitor of claim 18, wherein the vias have both rectangular and square shapes.

* * * * *